(12) United States Patent
Chung et al.

(10) Patent No.: US 8,098,341 B2
(45) Date of Patent: Jan. 17, 2012

(54) THIN FILM TRANSISTOR SUBSTRATE AND LIQUID CRYSTAL DISPLAY DEVICE USING THE SAME

(75) Inventors: Te-Chen Chung, KunShan (CN); Tean-Sen Jen, KunShan (CN); Yu-Wen Chiu, KunShan (CN); Chia-Te Liao, KunShan (CN)

(73) Assignee: Infovision Optoelectronics (Kunshan) Co. Ltd. (CN)

( * ) Notice: Subject to any disclaimer, the term of this patent is extended or adjusted under 35 U.S.C. 154(b) by 314 days.

(21) Appl. No.: 12/412,210

(22) Filed: Mar. 26, 2009

(65) Prior Publication Data
US 2009/0244429 A1    Oct. 1, 2009

(30) Foreign Application Priority Data

Mar. 31, 2008    (CN) .......................... 2008 1 0090963

(51) Int. Cl.
*G02F 1/136*    (2006.01)
(52) U.S. Cl. ........................................................ 349/43
(58) Field of Classification Search ............... 349/152
See application file for complete search history.

(56) References Cited

U.S. PATENT DOCUMENTS

| 7,110,057 | B2 | 9/2006 | Jeon | |
| 2008/0284969 | A1* | 11/2008 | Lim | 349/152 |
| 2008/0297713 | A1* | 12/2008 | Chen | 349/152 |
| 2009/0296039 | A1* | 12/2009 | Park | 349/149 |
| 2010/0321624 | A1* | 12/2010 | Yanagisawa | 349/152 |

FOREIGN PATENT DOCUMENTS

| JP | 2002-287662 | 10/2002 |
| JP | 2003-114447 | 4/2003 |

* cited by examiner

*Primary Examiner* — Sung Pak
(74) *Attorney, Agent, or Firm* — Perkins Coie LLP; Yingli Wang

(57) ABSTRACT

The invention provides a thin film transistor (TFT) substrate comprises a plurality of gate lines, a plurality of data lines, gate terminals, data terminals and thin film transistors as well as a liquid crystal display (LCD) device having the TFT substrate. The gate terminal and/or data terminal contain a first portion and a second portion, and the first potion and the second portion are connected electrically with an end electrode made of a material which is anticorrosive in the air. The thin film transistor substrate of the invention prevents the spreading of the metal corrosion occurred at the gate leads to the display region of the LCD, and therefore the quality of the LCD device can be ensured.

18 Claims, 9 Drawing Sheets

THIN FILM TRANSISTOR SUBSTRATE AND LIQUID CRYSTAL DISPLAY DEVICE USING THE SAME

CROSS REFERENCE TO RELATED APPLICATIONS

This application claims the priority of Chinese Patent Application No. 200810090963.X filed on Mar. 31, 2008, which is hereby incorporated in its entirety by reference.

FIELD OF THE INVENTION

The invention relates to the field of liquid crystal display, and particularly, it relates to a thin film transistor substrate and a liquid crystal display device having the same.

BACKGROUND OF THE INVENTION

Currently, a test process will be performed to test whether thin film transistors (TFT) for controlling the display of the respective pixels in a liquid crystal display panel work well or not when a liquid crystal display panel (LCD panel) has been produced. Therefore, the layout of a test circuit should be arranged around the liquid crystal display panel, and mostly, in the manner of the shorting-bar layout.

A schematic view of a conventional thin film transistor substrate (TFT substrate) having a test circuit with the shorting-bar layout is shown in FIG. 1. In FIG. 1, the reference number 2 represents gate lines, the reference number 3 represents data lines, the reference number 4 represents gate terminals, the reference number 5 represents data terminals, the reference number 21 represents gate leads, the reference number 26 represents data leads, the reference numbers 22, 23 represent gate shorting bars, the reference numbers 27, 28 represent data shorting bars, and the reference number 10 represents thin film transistors for controlling the display of the respective pixels. The thin film transistor substrate is formed by intersecting perpendicularly a plurality of gate lines 2 connected with the gate driving terminal G and a plurality of data lines 3 connected with the data driving terminal D. The gate lines 2 and the data lines 3 are used for transferring the scan signals and the data signals (so both the gate lines and the data lines can be referred to as the signal lines), respectively, and the thin film transistors 10 for controlling the display of the respective pixels are disposed at the positions where a plurality of gate lines 2 and a plurality of data lines 3 intersect perpendicularly. The gate lines 2 are connected with the gate leads 21 via the gate terminals 4, and are connected to the a peripheral test circuit by using the corresponding gate shorting bars; the data lines 3 are connected with the data leads 26 via the data terminals 5, and are connected to the peripheral test circuit by using the corresponding data shorting bars. Herein, the adjacent gate leads are connected with different gate shorting bars, respectively, and the adjacent data leads are connected with different data shorting bars, respectively. After completing the test of the thin film transistor substrate, the peripheral test circuit is cut off along the cut off line 20 (including the gate terminal side and the data terminal side) as shown in FIG. 1 for performing the subsequent processes.

An enlarged plan view for illustrating the region near the gate terminal 4 is shown in FIG. 2A, and a section plan taken along a straight line I-I in FIG. 2A is shown in FIG. 2B. As shown in FIG. 2A and FIG. 2B, single layer metal of molybdenum, is used as the material of the gate lines. In the procedures for producing the gate line 2, the gate terminal 4 and the gate lead 21 are integrated on a glass substrate 1. Then, a gate insulation layer 6 is deposited, and an active layer 7 and an Ohm contact layer 14 are deposited sequentially on the gate insulation layer 6. After that, a source 8, a drain 9 and gate shorting bars 22, 23 (they are not shown herein, but the gate insulation layer above the end of the gate lead 21 is etched locally to form a through hole which allows the gate shorting bars to be connected electrically with the gate lead for testing the TFT substrate) are formed by using the single molybdenum layer. Next, a passivation layer 11 is deposited, and a gate end electrode 13 is formed by using the material of indium tin oxide (ITO), and the gate end electrode 13 is connected electrically with the gate terminal 4 via a contact hole 12. Finally, the gate leads 21 between the gate shorting bars and the gate terminals 4 are cut off along the cut off line 20 in order to separate the thin film transistor substrate from the peripheral test circuit.

It should be noted that after the gate leads 21 between the gate shorting bars and the gate terminals 4 are cut off, the section of the gate leads 21 is exposed in the air, therefore the vapor in the air will enter the section of the gate leads, while the metal molybdenum used for forming the gate leads 21 is a metal which is easy to be corroded, that is, it is likely that the metal is easily corroded on the section of the gate leads 21, as shown in FIG. 3. Moreover, the corrosion will spread further to the gate terminals 4 even to corrode the gate lines, thus the quality of the LCD panel will be affected. In addition to the single molybdenum layer, the single aluminum layer, molybdenum/aluminum composite layer used cannot satisfy the quality requirement for the TFT substrate either, due to being vulnerable to be corroded in the air. Also, the metal corrosion may happen near the data terminals of the thin film transistor substrate, similar to the metal corrosion produced near the gate terminal.

SUMMARY OF THE INVENTION

The embodiments of the invention relate to a thin film transistor substrate and a liquid crystal display device having the same which can effectively prevent the spreading of metal corrosion from the gate and data terminals to the display region when the leads between the display region and a peripheral test circuit of the thin film transistor substrate are cut off.

One aspect of the invention relates to a thin film transistor substrate comprising a plurality of signal lines, a plurality of thin film transistors, a plurality of signal terminals having one end connected with said plurality of signal lines, and a plurality of signal leads connected with another end of said plurality of signal terminals. Said signal terminal comprises a first signal terminal portion and a second signal terminal portion, and the first signal terminal portion and the second signal terminal portion are connected electrically by a signal end electrode made of anticorrosive material.

Another aspect of the invention relates to a liquid crystal display device comprising a plurality of signal lines and signal leads, a plurality of thin film transistors, and a plurality of signal terminal respectively and electrically connecting the corresponding signal lines with the corresponding signal leads. The signal terminal comprises a first signal terminal portion and a second signal terminal portion, and the first signal terminal portion and the second signal terminal portion are connected electrically via a signal end electrode.

As described above, by using the thin film transistor substrate and the liquid crystal display device having the same of the invention, which features in setting two independent gate terminal portions or two independent data terminal portions, and using the anticorrosive material ITO to electrically connect the two terminals, the metal corrosion is prevented from spreading to the display region, and the quality of the liquid crystal display device can be ensured. Further, by changing the straight leads to an S shape, an approximate S shape, or other curve or similar shapes, the lead region can be enlarged thereby the corrosion of the leads can be delayed and the possibility of spreading the corrosion to the display region can further be reduced.

BRIEF DESCRIPTION OF THE DRAWINGS

After reading the specific embodiments of the invention by referring to the drawings, the respective aspects of the invention will be understood more clearly.

DETAILED DESCRIPTION OF THE INVENTION

Figure 1:
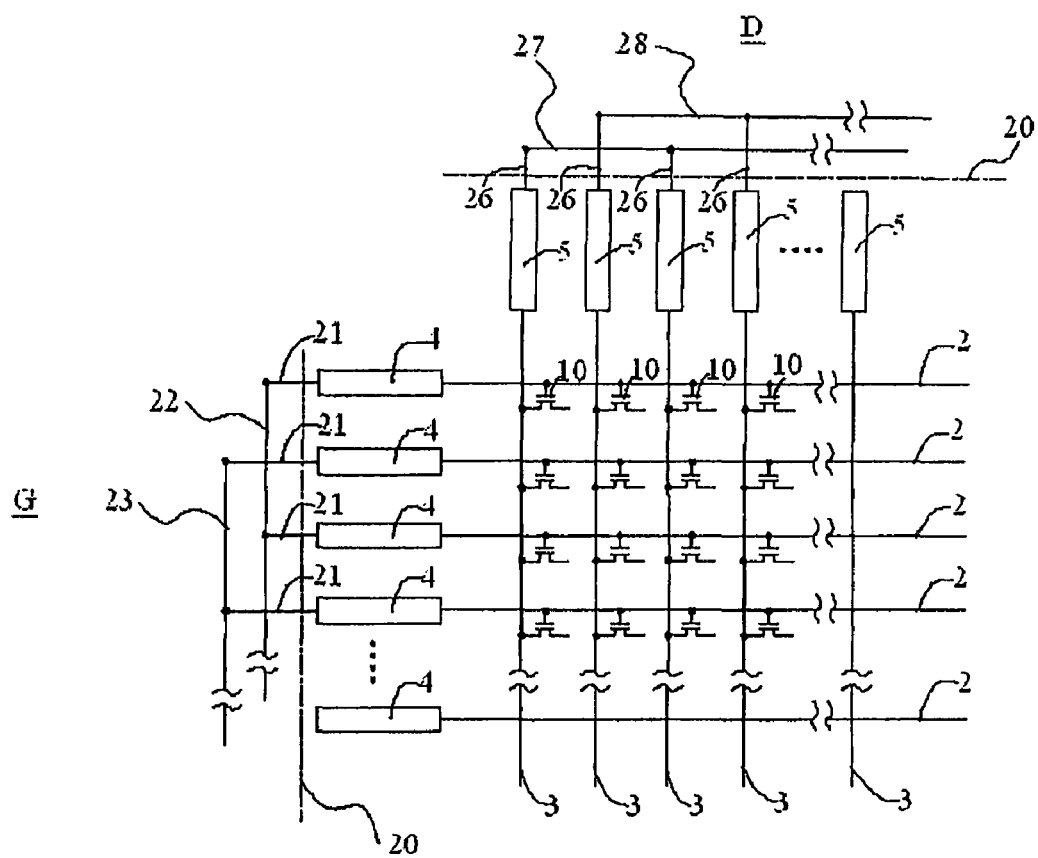
FIG. 1 is a schematic view of a conventional thin film transistor substrate having shorting-bar layout circuit.
Figure 2A:
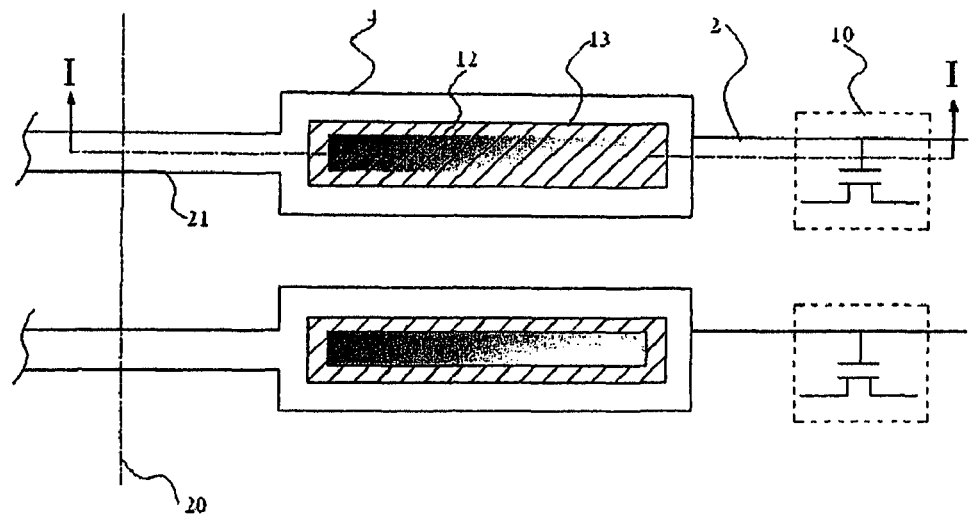
FIG. 2A is a plan view illustrating a region near the gate terminal of a thin film transistor substrate of FIG. 1.
Figure 2B:
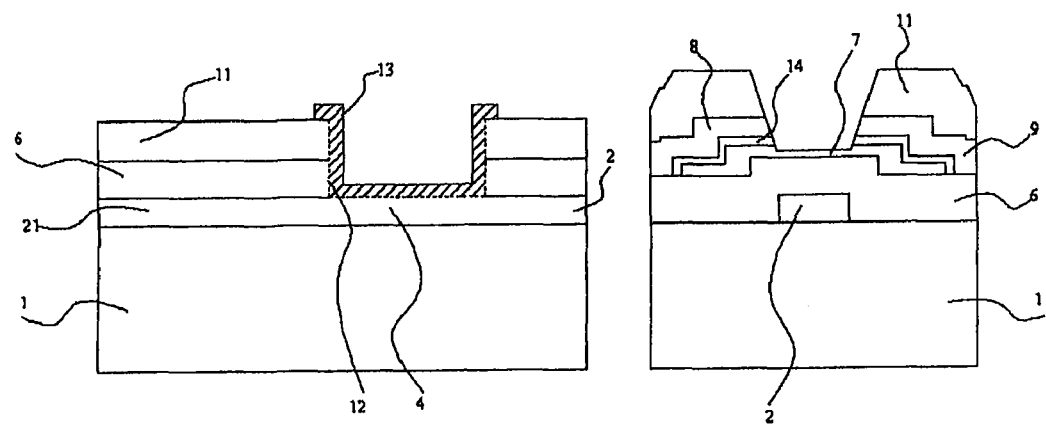
FIG. 2B is a section plan taken along the straight line I-I in FIG. 2A.
Figure 3:
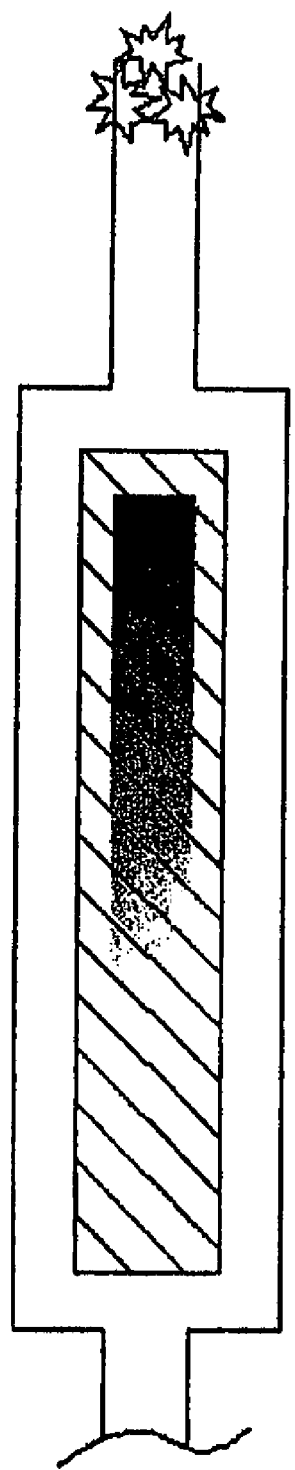
FIG. 3 is a schematic view illustrating a corrosion phenomenon occurs after the gate lead shown in FIG. 2A is cut off.

The specific embodiments of the invention will now be described in details by referring to the drawings as follows.

Embodiment 1

Figure 4A:
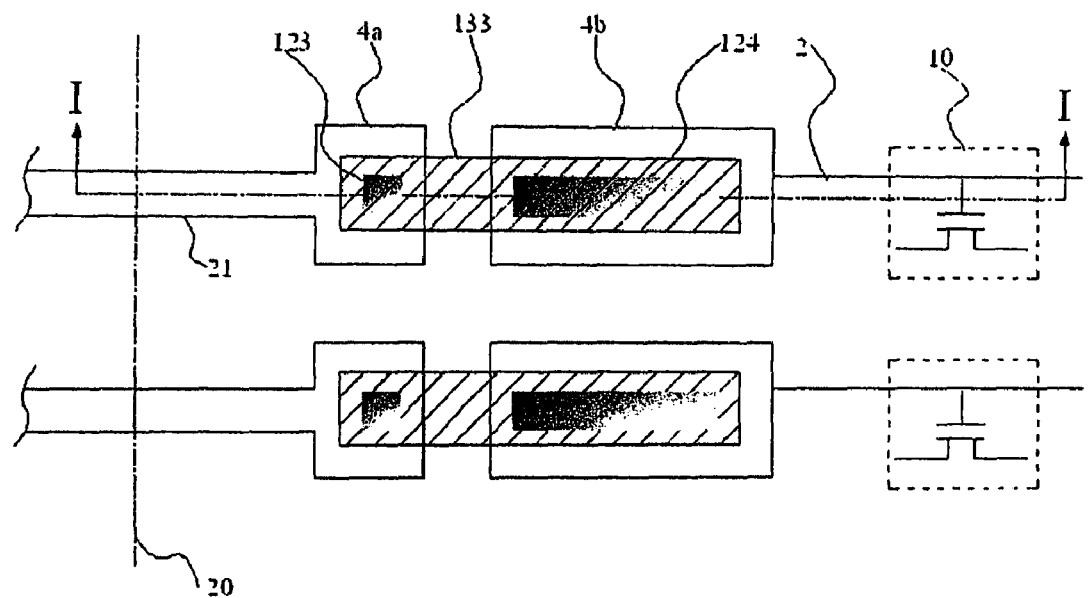
FIG. 4A is a plan view illustrating a region near the gate terminal of a thin film transistor substrate according to a first embodiment of the invention.
Figure 4B:
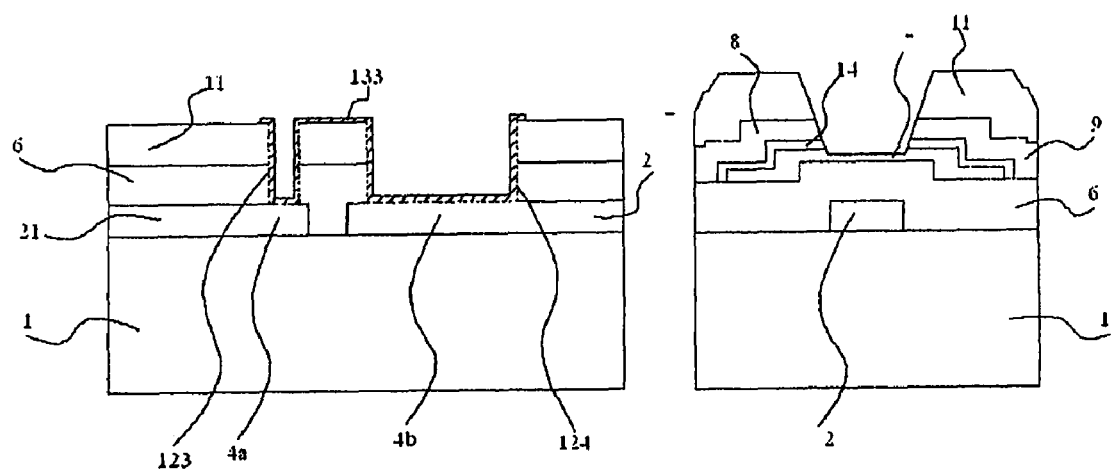
FIG. 4B is a section plan taken along the straight line I-I in FIG. 4A.

FIG. 4A is a plan view illustrating a region near the gate terminal of a thin film transistor substrate according to a first embodiment of the invention; while FIG. 4B is a section plan taken along the straight line I-I in FIG. 4A. The circuit structure of the thin film transistor substrate shown in FIG. 4A and 4B is the same as that described in FIG. 1, so it will not be described repeatedly.

Referring to FIGS. 4A and 4B, a single molybdenum layer is used as the gate material. In a step for producing gate lines 2, a gate lead 21, a first gate terminal portion 4a and a second gate terminal portion 4b are formed integrally on the glass substrate 1 along the edge of the finally formed TFT substrate, wherein the gate lead 21 is connected to the first gate terminal portion 4a. Then, the gate insulation layer 6 is deposited and an active layer 7 and an Ohm contact layer 14 are formed on the gate insulation layer 6 sequentially. Next, a source 8, a drain 9 and gate shorting bars 22, 23 are formed by using the single molybdenum layer (it is not shown herein, but there is also a through hole formed by etching locally the gate insulation layer above the end of the gate lead 21 so that the gate shorting bar and the gate lead are connected electrically, and the test to the TFT substrate can be performed). Subsequently, a passivation layer 11 is deposited, and the gate end electrode 133 is formed by indium tin oxide (ITO).

The process for forming the gate end electrode 133 will be described in detail as follows: the gate insulation layer and the passivation layer above the first gate terminal portion 4a and the second gate terminal portion 4b are etched locally thereby a first contact hole 123 and a second contact hole 124 are formed, respectively, then, the first contact hole 123 and the second contact hole 124 are covered by depositing ITO, finally, a gate end electrode 133 with one end connected electrically with the first gate terminal portion 4a and the other end connected electrically with the second gate terminal portion 4b is formed. There is no difference between the structure of the invention and the structure in which the single gate terminal is used for testing the circuit, so, the TFT substrate can be tested in the same manner after the peripheral test signal is inputted to the second gate terminal portion 4b via the first gate terminal portion 4a and the gate end electrode 133. Finally, the gate lead 21 between the gate shorting bar (not shown) and the first gate terminal portion 4a is cut off along the cut off line 20 in order to separate the TFT substrate from the peripheral test circuit.

As shown in FIG. 4A, the gate end electrode 133 is located at a position far from the cut off line 20, however, this is not a restriction to the invention, the gate end electrode 133 may has different shapes and positions, for example, the gate end electrode formed can extend straight to the cut off line, that is, the test can also be performed by using the extending portion to replace the gate lead 21. However, there is a problem for such design, because the extending portion replacing the gate lead 21 is made of ITO, the impedance of ITO is larger than that of the gate lead 21, which is made of metal molybdenum, the signal delay may be occurred during the test, so the structure shown in FIG. 4A is preferred in the invention.

Figure 5:
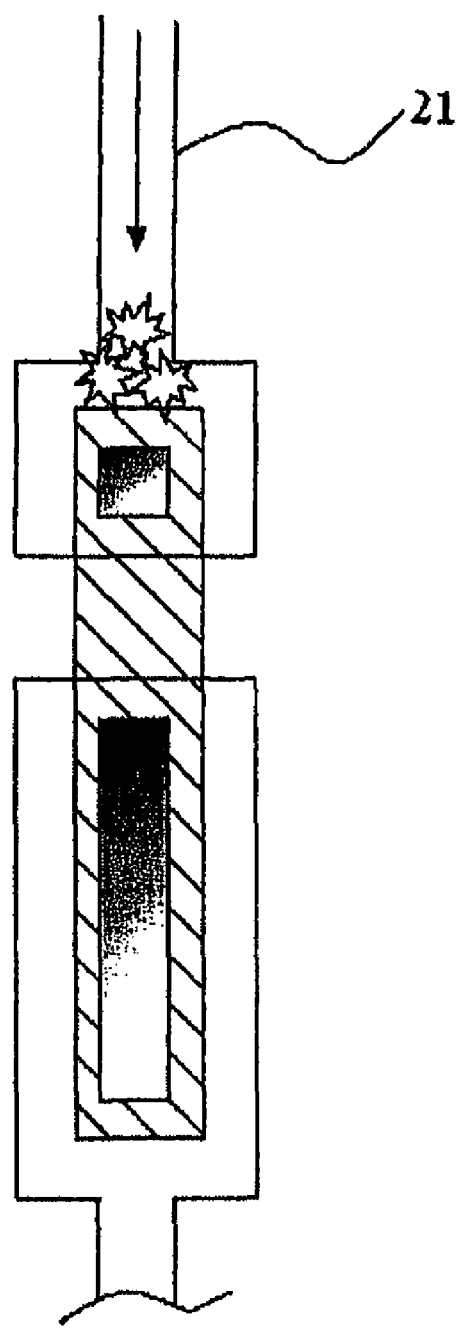
FIG. 5 is a schematic view illustrating a corrosion phenomenon occurs after the gate lead shown in FIG. 4A is cut off.

In such a TFT substrate, the section of the gate lead 21 will expose in the air, and the vapor will enter said section, while the molybdenum, which is the material of the gate lead 21, is vulnerable to be corroded, therefore, the metal corrosion is easy to occur at the section and will spread towards the first gate terminal portion 4a, as shown in FIG. 5. However, the first gate terminal portion 4a and the second gate terminal portion 4b are separated apart with respect to their position relationship, that is, the first gate terminal portion 4a and the second gate terminal portion 4b are not connected electrically but disconnected, and the gate insulation material, the passivation material and ITO are sequentially deposited in the following process, thereby the gate end electrode 133 formed of ITO is used as a midway bridge to realize the electrical connection between the first gate terminal portion 4a and the second gate terminal portion 4b, meanwhile, the material ITO for forming the gate end electrode 133 is not vulnerable to be corroded in the air, even though the corrosion has spread to the first gate terminal portion 4a, the path of the corrosion to the second gate terminal portion 4b is blocked by the gate end electrode 133, the passivation layer and the gate insulation layer, thereby the second gate terminal portion 4b and the subsequent gate lines can be protected.

It is noted that after completing the test process for the TFT substrate, the first gate terminal portion 4a is no longer used for transferring the signals, and all signals are transferred to the gate lines via the second gate terminal portion 4b, so even if the first gate terminal portion 4a is corroded, the second gate terminal portion 4b and the gate lines will not be affected thereby the normal signal transferring of the panel can be ensured.

Embodiment 2

Figure 6:
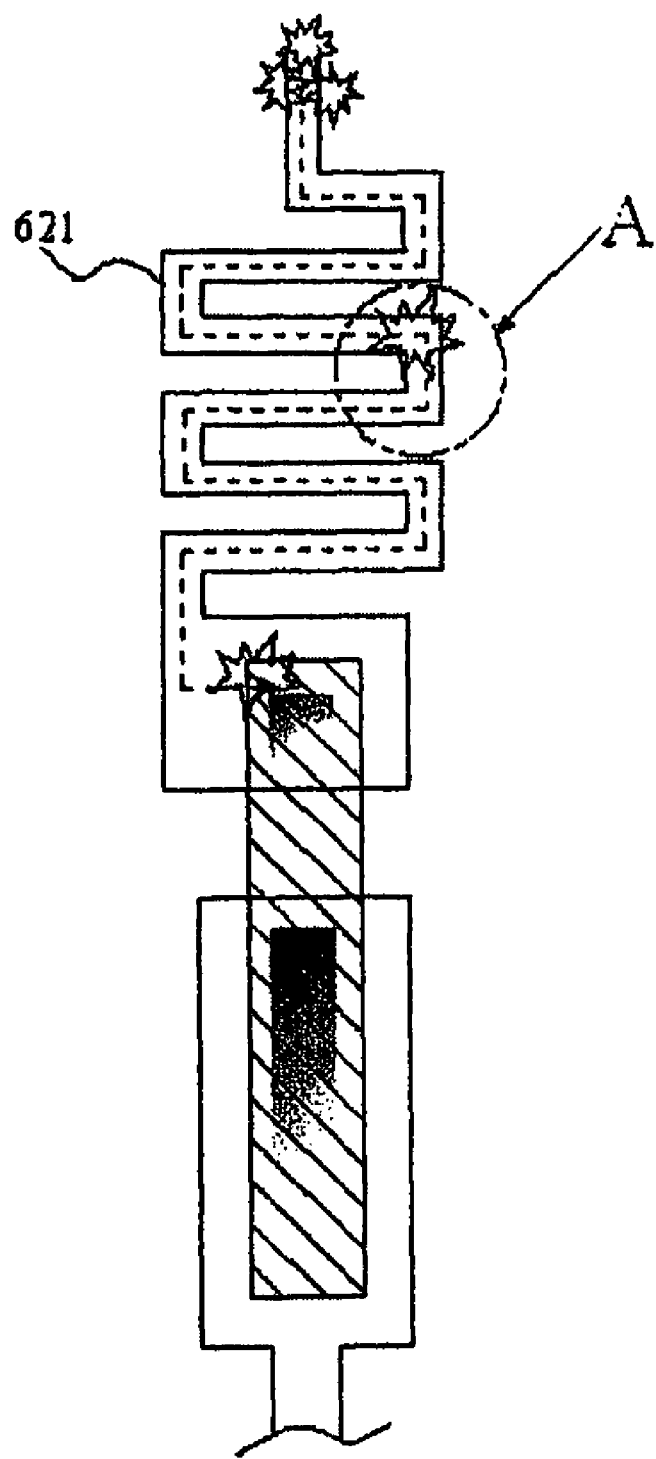
FIG. 6 is a plan view illustrating a region near the gate terminal of a thin film transistor substrate according to a second embodiment of the invention.

FIG. 6 is a plan view illustrating a region near the gate terminal of a thin film transistor substrate according to a second embodiment of the invention. To be brief, the parts which have the same structure and function as those in Embodiment 1 will not be labeled with the reference numbers and described.

The difference between Embodiment 2 and Embodiment 1 is that the straight line gate lead 21 is changed to the "S shape" gate lead 621, as shown by the arrow A in FIG. 6, it is designed to have two right-angle bends, and the length of the gate lead can be increased with using such a structure thereby the length of the path for spreading the metal corrosion occurred at the section to the first gate terminal portion 4a is increased, and it has the effect of delaying the metal corrosion to a certain extent, that is, the possibility of occurring the corrosion at the second gate terminal portion 4b can be further decreased due to delaying the metal corrosion at the first gate terminal portion 4a.

Embodiments 3, 4

Figure 7:
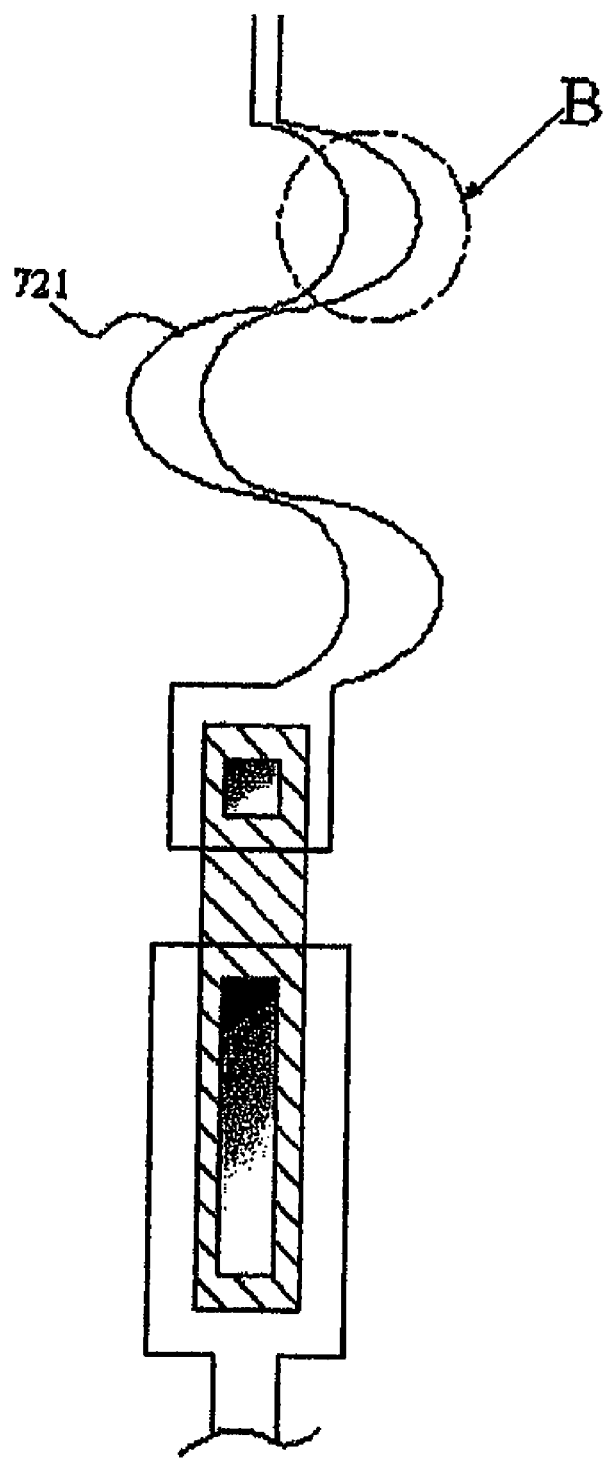
FIG. 7 is a plan view illustrating a region near the gate terminal of a thin film transistor substrate according to a third embodiment of the invention.
Figure 8:
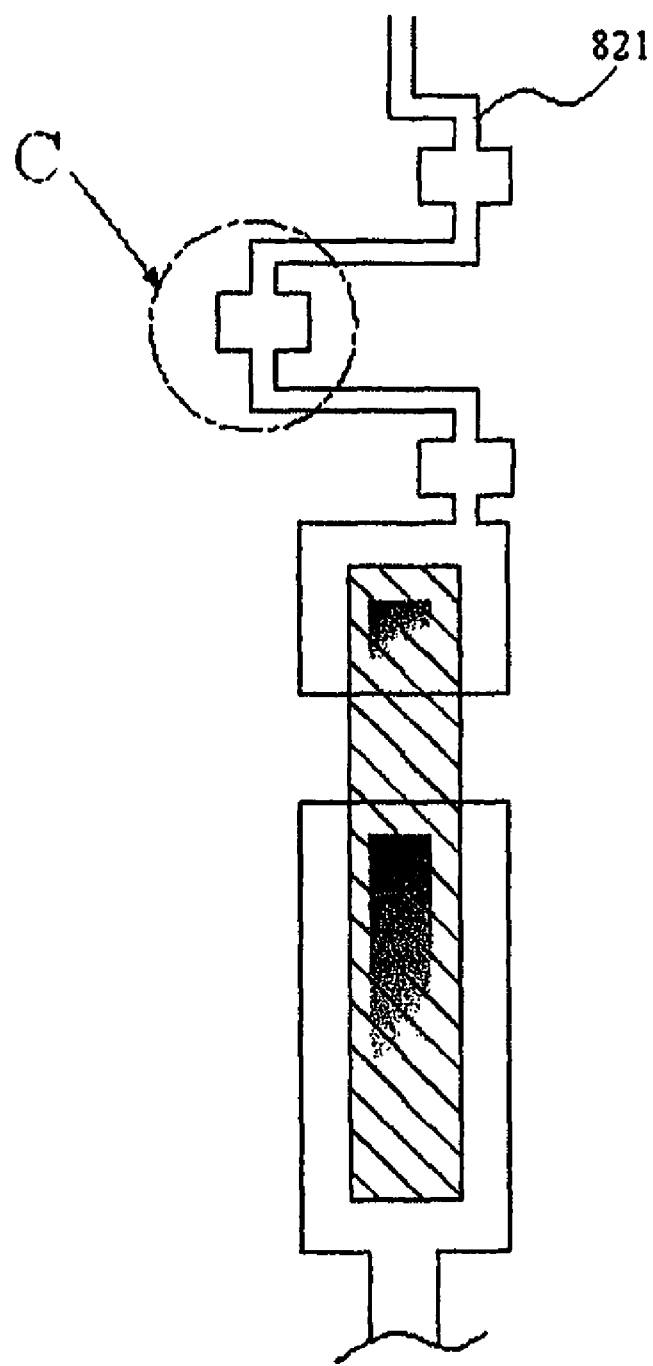
FIG. 8 is a plan view illustrating a region near the gate terminal of a thin film transistor substrate according to a fourth embodiment of the invention.

FIG. 7 is a plan view illustrating a region near the gate terminal of a thin film transistor substrate according to a third embodiment of the invention; FIG. 8 is a plan view illustrating a region near the gate terminal of a thin film transistor substrate according to a fourth embodiment of the invention.

Referring to FIG. 7 and FIG. 8, Embodiments 3 and 4 are similar to Embodiment 2, "approximate S shape" gate leads 721 and 821 are used therein, respectively. The main differences between them are the regions shown by the arrows B and C in FIG. 7 and FIG. 8. Comparing the region indicated by the arrow B in FIG. 7 and the region indicated by the arrow C in FIG. 8 with that in Embodiment 2, the section areas of the gate leads are increased. If the metal corrosion occurred at the cut off surface spreads to the first gate terminal portion 4a, it may not only pass through a longer path but also a gate lead region having larger section area thereby the effect of delaying the metal corrosion can further be strengthen, that is, the possibility of occurring the corrosion at the second gate terminal portion 4b can be further reduced by delaying the metal corrosion at the first gate terminal portion 4a.

Embodiment 5

Figure 9A:
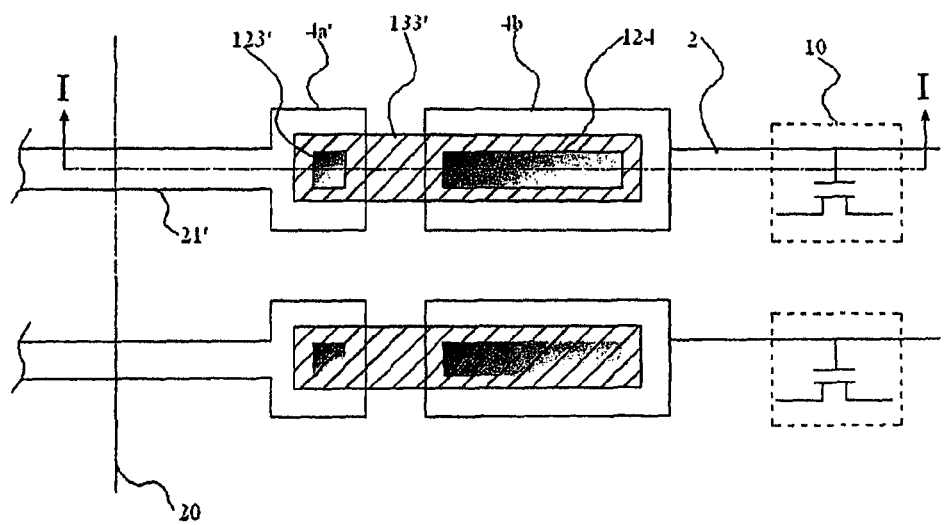
FIG. 9A is a plan view illustrating a region near the gate terminal of a thin film transistor substrate according to a fifth embodiment of the invention.
Figure 9B:
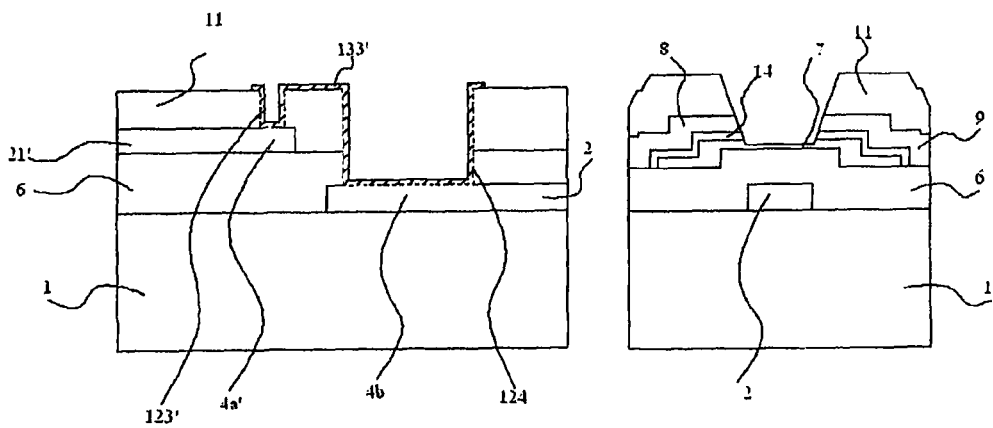
FIG. 9B is a section plan taken along the straight line I-I in FIG. 9A.

FIG. 9A is a plan view illustrating a region near the gate terminal of a thin film transistor substrate according to a fifth embodiment of the invention; while FIG. 9B is a section plan taken along the straight line I-I in FIG. 9A. By comparing with Embodiment 1, the differences therebetween will be described herein.

Firstly, gate lines 2, second gate terminal portions 4b and gate shorting bars (not shown) are formed of single molybdenum layer on the glass substrate 1. Then a gate insulation layer 6 is deposited, gate leads 21' and the first gate terminal portion 4a' are formed of the same single molybdenum layer on the gate insulation layer 6 (herein, the gate insulation layer above the gate shorting bars is etched locally to form a through hole thereby the gate lead and the gate shorting bar are connected electrically, thus the test of the thin film transistor substrate can be realized). Next, a passivation layer 11 is deposited, and a first contact hole 123' is formed by etching locally the passivation layer 11 above the first gate terminal portion 4a', and the gate insulation layer 6 and passivation layer 11 above the second gate terminal portion 4b are etched locally to form a second contact hole 124. Subsequently, the first contact hole 123' and the second contact hole 124 are covered by depositing ITO, and finally, a gate end electrode 133' having one end connected electrically with the first gate terminal portion 4a' and the other end connected electrically with the second gate terminal portion 4b is formed.

Thus it can be seen, the main difference between Embodiment 5 and Embodiment 1 is that two gate terminals are not formed by the metal material of the same layer, that is, the two gate terminal portions in Embodiment 1 are made of the first layer of the metal material (that is, the first metal layer), while according to Embodiment 5, the second gate terminal portion 4b is formed of first metal layer, while the first gate terminal portion 4a' is formed of second layer of the metal material (that is the second metal layer). That is, in Embodiment 5, the two gate terminal portions are not located at the same horizontal layer, and a gate insulation layer is disposed therebetween, thereby the metal corrosion which is possible to occur at the first gate terminal portion 4a' can only spread to the second gate terminal portion 4b by passing through the gate insulation layer, while this situation rarely occurs. Therefore it can enhance the protection for the second gate terminal portion 4b, and increase the reliability of the LCD panel.

The gate terminals of the invention are described supra in detail. For the data terminals, the situation is the same, and therefore the repetitive description of which is omitted. One skilled in the art can easily make and use the data terminals in view of the description of the gate terminals. Furthermore, for those signal terminals connected with other signal lines on the thin film transistor substrate, the improved solution used for the gate terminals as described above can be used similarly to prevent the problem of metal corrosion.

Those skilled in the art should understand, the same lead design as described in Embodiments 2, 3 and 4 can also be used in Embodiment 5, and the repetitive description of which is omitted.

In the above description, the embodiments of the invention have been described by referring to the drawings. However, it shall be understood by person skilled in the art, that although the metal material molybdenum is used to form the gate lines, gate terminals, gate leads, and the like in the above embodiments, but the metal material, such as the single aluminum layer, molybdenum/aluminum composite layer, can also be used to form the gate lines, the gate terminals, and the gate leads; and the anticorrosive material ITO can also be replaced by the similar anticorrosive material, such as indium zinc oxide (IZO), and the like. The specific embodiments of the invention can be modified and changed without departing the spirit and scope of the invention. All of the modifications and changes fall within the scope as defined in the Claims of the invention.

What is claimed is:

1. A thin film transistor substrate comprising: a plurality of signal lines, a plurality of thin film transistors, a plurality of signal terminals having one end connected with said plurality of signal lines, and a plurality of signal leads connected with the other end of said plurality of signal terminals, wherein said signal terminal comprises a first signal terminal portion and a second signal terminal portion, wherein the first signal terminal portion and the second signal terminal portion are connected electrically by a signal end electrode made of anticorrosive material, and wherein the signal lead comprises an enlarged region having a larger section area for further delaying the metal corrosion.

2. The thin film transistor substrate of claim 1, wherein said signal line comprises a gate line and/or a data line, said signal lead comprises a gate lead and/or a signal lead, and said signal terminal comprises a gate terminal and/or a data terminal.

3. The thin film transistor substrate of claim 1, wherein said anticorrosive material is indium tin oxide (ITO) or indium zinc oxide (IZO).

4. The thin film transistor substrate of claim 1, wherein said first signal terminal portion and said second signal terminal portion are made of a metal layer selected from the group consisting of a single molybdenum layer, a single aluminum layer, and a molybdenum-aluminum composite layer.

5. The thin film transistor substrate of claim 1, wherein said signal lead has an S shape or an approximate S shape.

6. The thin film transistor substrate of claim 1, wherein said first signal terminal portion and said second signal terminal portion are made of the same metal layer.

7. The thin film transistor substrate of claim 1, wherein said first signal terminal portion and said second signal terminal portion are made of different metal layers.

8. The thin film transistor substrate of claim 7, wherein an insulation layer is disposed between said first signal terminal portion and said second signal terminal portion.

9. A liquid crystal display device comprising:
a plurality of signal lines and signal leads,
a plurality of thin film transistors, and
a plurality of signal terminal respectively and electrically connecting the corresponding signal lines with the corresponding signal leads, wherein
the signal terminal comprises a first signal terminal portion and a second signal terminal portion, wherein the first signal terminal portion and the second signal terminal portion are connected electrically via a signal end electrode, and wherein the signal lead comprises an enlarged region having a larger section area for further delaying the metal corrosion.

10. The liquid crystal display device of claim 9, wherein said first signal terminal portion and said second signal terminal portion are made of the same metal layer.

11. The liquid crystal display device of claim 9, wherein said first signal terminal portion and said second signal terminal portion are made of different metal layers.

12. The liquid crystal display device of claim 9, wherein the signal end electrode is made of anticorrosive material.

13. The liquid crystal display device of claim 12, wherein the anticorrosive material is ITO or IZO.

14. The liquid crystal display device of claim 9, wherein the signal lead comprises a curved portion having a longer length.

15. The liquid crystal display device of claim 9, wherein a first signal terminal portion and a second signal terminal portion are respectively connected with the signal end electrode via through holes.

16. A thin film transistor substrate comprising: a plurality of signal lines, a plurality of thin film transistors, a plurality of signal terminals having one end connected with said plurality of signal lines, and a plurality of signal leads connected with the other end of said plurality of signal terminals, wherein said signal terminal comprises a first signal terminal portion and a second signal terminal portion, wherein the first signal terminal portion and the second signal terminal portion are connected electrically by a signal end electrode made of anticorrosive material, and wherein said signal lead has an S shape or an approximate S shape.

17. The thin film transistor substrate of claim 16, wherein said first signal terminal portion and said second signal terminal portion are made of different metal layers.

18. The thin film transistor substrate of claim 16, wherein the signal lead comprises an enlarged region having a larger section area for further delaying the metal corrosion.

* * * * *